United States Patent
Dunne et al.

(10) Patent No.: US 9,209,930 B2
(45) Date of Patent: *Dec. 8, 2015

(54) MANAGING QUALITY OF SERVICE FOR COMMUNICATION SESSIONS

(71) Applicants: International Business Machines Corporation, Armonk, NY (US); National University of Ireland Maynooth, Kildare (IE)

(72) Inventors: Jonathan Dunne, Dungarvan (IE); James P. Galvin, Jr., Georgetown, KY (US); Daniel B. Kehn, Cary, NC (US); Patrick J. O'Sullivan, Ballsbridge (IE); Hitham Ahmed Assem Aly Salama, Blanchardstown (IE)

(73) Assignees: International Business Machines Corporation, Armonk, NY (US); National University of Ireland Maynooth, Kildare (IE)

( * ) Notice: Subject to any disclaimer, the term of this patent is extended or adjusted under 35 U.S.C. 154(b) by 0 days.

This patent is subject to a terminal disclaimer.

(21) Appl. No.: 14/219,633

(22) Filed: Mar. 19, 2014

(65) Prior Publication Data

US 2015/0082127 A1    Mar. 19, 2015

Related U.S. Application Data

(63) Continuation of application No. 14/031,615, filed on Sep. 19, 2013.

(51) Int. Cl.
| | |
|---|---|
| *H03M 13/35* | (2006.01) |
| *H04L 1/00* | (2006.01) |
| *H03M 13/05* | (2006.01) |
| *H03M 13/53* | (2006.01) |

(52) U.S. Cl.
CPC ............ *H04L 1/0009* (2013.01); *H03M 13/05* (2013.01); *H03M 13/353* (2013.01); *H04L 1/0017* (2013.01); *H04L 2001/0098* (2013.01)

(58) Field of Classification Search
CPC ... H04L 1/0057; H04L 1/0009; H04L 1/1819; H04L 1/0045; H04L 43/50; H04L 2001/0098; H04L 1/0017; H03M 13/1515; H03M 13/116; H03M 13/05; H03M 13/353
See application file for complete search history.

(56) References Cited

U.S. PATENT DOCUMENTS

| | | | | |
|---|---|---|---|---|
| 2004/0015765 | A1* | 1/2004 | Cooper et al. | 714/750 |
| 2004/0160979 | A1* | 8/2004 | Pepin et al. | 370/462 |
| 2010/0312552 | A1 | 12/2010 | Zheng et al. | |
| 2012/0047270 | A1* | 2/2012 | Chandrasekaran et al. | 709/227 |

* cited by examiner

*Primary Examiner* — April Y Blair
*Assistant Examiner* — Dipakkumar Gandhi
(74) *Attorney, Agent, or Firm* — Holland & Knight LLP; Brian J. Colandreo, Esq.; Jeffrey T. Placker, Esq.

(57) ABSTRACT

A computer-implemented method, computer program product, and computing system is provided for managing quality of service for communication sessions. In an implementation, a method may include determining network condition associated with a communication session. The method may also include calculating one or more anticipated performance attributes for each of a plurality of error correction codes based on the network condition. The method may also include determining a quality of experience metric for each of the plurality of error correction codes based on the calculated one or more anticipate performance attributes for each of the plurality of error correction codes. The method may further include establishing one of the plurality of error correction codes for the communication session based on the quality of experience metric for each of the plurality of error correction codes.

7 Claims, 9 Drawing Sheets packet loss = 8%
burst ratio = 2
MOS = 3.1

MANAGING QUALITY OF SERVICE FOR COMMUNICATION SESSIONS

RELATED APPLICATIONS

The subject application is a continuation application of U.S. Patent Application with Ser. No. 14/031,615, filed on Sep. 19, 2013, the entire content of which is herein incorporated by reference.

TECHNICAL FIELD

The present disclosure generally relates to systems and method for electronic communications, and more particularly relates to managing quality of service for electronic communication sessions.

BACKGROUND

Various collaboration systems exist for enabling individuals to engage in collaborate activities, such as working together on projects, sharing information, and the like. Collaboration systems can be particularly useful in allowing geographically dispersed individuals to interact and work with one another. Using various different collaboration systems, or multi-functional collaboration systems, individuals who are geographically remote from one another may, for example, engage in common work projects, for example, using online team work spaces, participate in interactive discussions, for example, using teleconferencing or video conferencing systems, and engage in meetings, for example, using electronic meeting systems that allow for presentations, lectures, seminars, and the like.

SUMMARY OF DISCLOSURE

According to an implementation, a computer-implemented method may include determining, by a processor, network condition associated with a communication session. The method may also include calculating, by the processor, one or more anticipated performance attributes for each of a plurality of error correction codes based on the network condition. The method may also include determining, by the processor, a quality of experience metric for each of the plurality of error correction codes based on the calculated one or more anticipate performance attributes for each of the plurality of error correction codes. The method may further include establishing, by the processor, one of the plurality of error correction codes for the communication session based on the quality of experience metric for each of the plurality of error correction codes.

One or more of the following features may be included. Determining the network condition associated with the communication session may be in response to a request to establish the communication session. Determining the network condition associated with the communication session may be in response to receiving an indication of a poor quality of experience associated with the communication session. The anticipated performance attributes may include one or more of packet loss, burst ratio, and delay.

The method may also include determining a changed network condition. One or more changed anticipated performance attributes may be calculated for each of the plurality of error correction codes based on the changed network condition. A changed quality of experience metric may be determined for each of the plurality of error correction codes based on the changed anticipated performance attributes for each of the plurality of error correction codes. The error correction code for the communication session may be switched to one of the plurality of error correction codes based on the changed quality of experience metric for each of the plurality of error correction codes. Determining the changed network condition may be in response to receiving an indication of a poor quality of experience associated with the communication session. Determining the changed network condition may include monitoring network conditions associated with the communication session.

According to another implementation, a computer program product includes a computer readable medium having a plurality of instructions stored on it. When executed by a processor, the instructions may cause the processor to perform operations including determining network condition associated with a communication session. Instructions may also be included for calculating one or more anticipated performance attributes for each of a plurality of error correction codes based on the network condition. Instructions may also be included for determining a quality of experience metric for each of the plurality of error correction codes based on the calculated one or more anticipate performance attributes for each of the plurality of error correction codes. Instructions may further be included for establishing one of the plurality of error correction codes for the communication session based on the quality of experience metric for each of the plurality of error correction codes.

One or more of the following features may be included. Determining the network condition associated with the communication session may be in response to a request to establish the communication session. Determining the network condition associated with the communication session may be in response to receiving an indication of a poor quality of experience associated with the communication session. The anticipated performance attributes may include one or more of packet loss, burst ratio, and delay.

Instructions may also be included for determining a changed network condition. One or more changed anticipated performance attributes may be calculated for each of the plurality of error correction codes based on the changed network condition. A changed quality of experience metric may be determined for each of the plurality of error correction codes based on the changed anticipated performance attributes for each of the plurality of error correction codes. The error correction code for the communication session may be switched to one of the plurality of error correction codes based on the changed quality of experience metric for each of the plurality of error correction codes. Determining the changed network condition may be in response to receiving an indication of a poor quality of experience associated with the communication session. The instructions for determining the changed network condition may include instructions for monitoring network conditions associated with the communication session.

According to yet another implementation, a computing system includes a processor and a memory module coupled with the processor. The processor may be configured for determining network condition associated with a communication session. The processor may also be configured for calculating one or more anticipated performance attributes for each of a plurality of error correction codes based on the network condition. The processor may also be configured for determining a quality of experience metric for each of the plurality of error correction codes based on the calculated one or more anticipate performance attributes for each of the plurality of error correction codes. The processor may further be configured for establishing one of the plurality of error correction codes for the communication session based on the quality of experience metric for each of the plurality of error correction codes.

One or more of the following features may be included. Determining the network condition associated with the communication session may be in response to a request to establish the communication session. Determining the network condition associated with the communication session may be in response to receiving an indication of a poor quality of experience associated with the communication session. The anticipated performance attributes may include one or more of packet loss, burst ratio, and delay.

The processor may be further configured for determining a changed network condition. One or more changed anticipated performance attributes may be calculated for each of the plurality of error correction codes based on the changed network condition. A changed quality of experience metric may be determined for each of the plurality of error correction codes based on the changed anticipated performance attributes for each of the plurality of error correction codes. The error correction code for the communication session may be switched to one of the plurality of error correction codes based on the changed quality of experience metric for each of the plurality of error correction codes. Determining the changed network condition may be in response to receiving an indication of a poor quality of experience associated with the communication session.

The details of one or more implementations are set forth in the accompanying drawings and the description below. Other features and advantages will become apparent from the description, the drawings, and the claims.

BRIEF DESCRIPTION OF THE DRAWINGS

Like reference symbols in the various drawings indicate like elements.

DETAILED DESCRIPTION

Individuals may often engage in communication sessions, utilizing a data network for conveying the communications. Such communication sessions may include, for example, Voice-over-IP and Video-over-IP communications, in which the communications to and from each party may be conveyed as packetized data over a data network. The quality of these types of communications can be greatly effected by network conditions. For example, packet loss may be one important factor that may impact the perceived quality of experience of the individuals participating in a communication session. As packet loss increases the quality of the communication may be degraded, for example with the individuals experiencing broken or garbled audio signals, increased interference and noise, and the like.

Consistent with the present disclosure, error correction codes may be utilized improving the quality of experience associated with communication sessions. In some embodiments, network conditions may be monitored and appropriate error correction codes may be selected for the given network conditions that may achieve an advantageous balance between reducing or preventing packet loss and reducing or preventing other negative impacts on the communication session, such as the introduction of delays. For example, error correction codes, may be utilized to reduce the effects of packet loss by transmitting redundant data. For example, Reed-Solomon error correction codes may be implemented whereby audio data may be transmitted between participants of a communication along with parity information that may allow the information from lost packets to be recovered, thereby minimizing the impact of the lost packets.

While error correction codes may reduce the impact of lost packets, the error correction codes may increase the necessary bandwidth for the communication sessions, as by necessitating both the transmission of the audio data as well as parity information that can be utilized to recover lost packets. Similarly, error correction codes may introduce delay into the communication session, for example, because the receiver may not be able to begin playback for the audio unless it also receives the parity data. If the delay introduced by the error correction becomes great enough, the delay may cause a decrease in the quality of experience for the participants, even when the impact of lost packets may be slight. According to some embodiments, of the present disclosure, error correction codes may be selected for current and/or predicted network conditions such that the impact on the quality of experience resulting from packet loss, as well as from one-way delays between the participants, may be reduced. As such, it may be possible to increase the quality of experience for the participants of the communication session and/or to maintain the quality of experience within an acceptable level for the participants.

Figure 1:
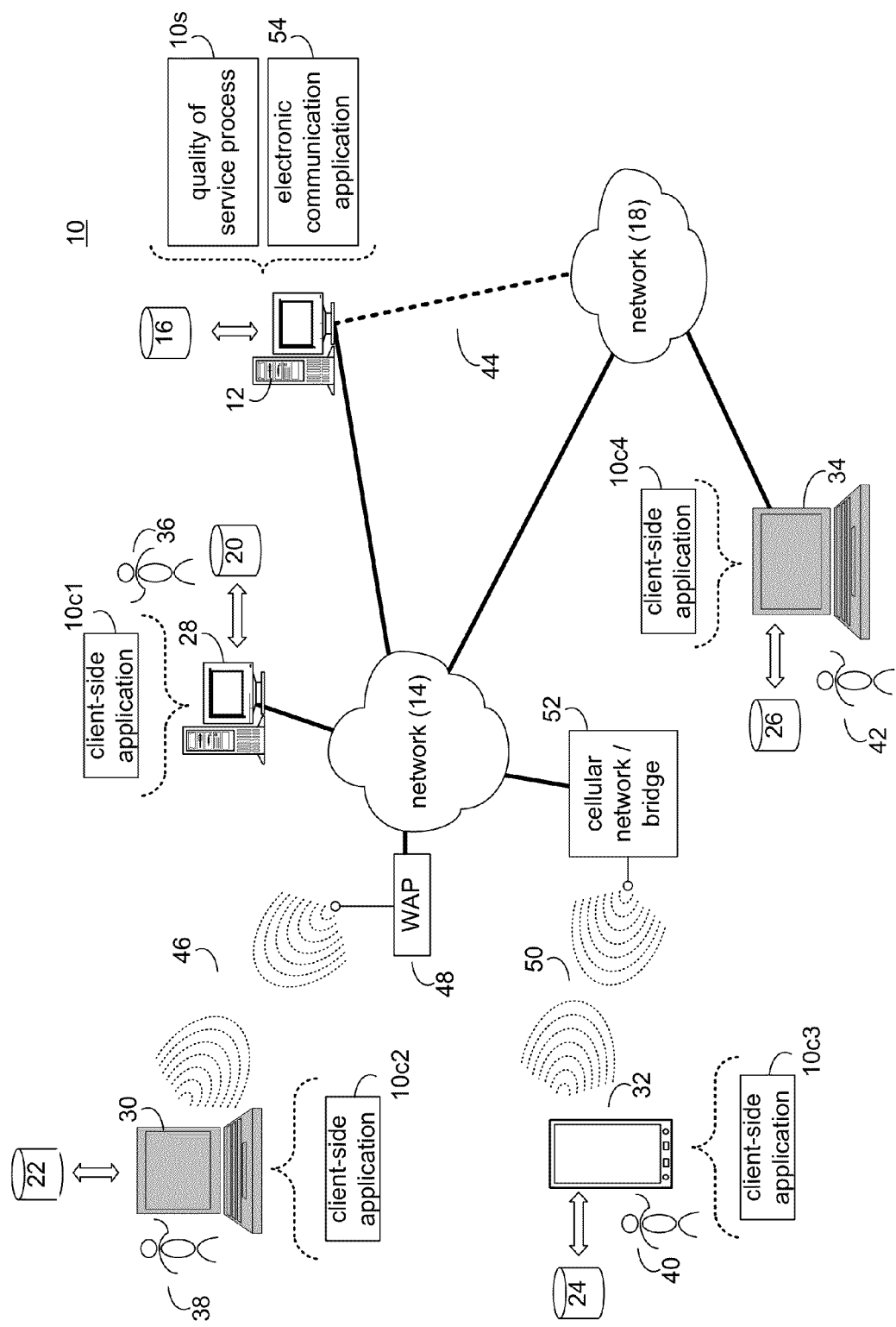
FIG. 1 is a diagrammatic view of a distributed computing network including a computing device that executes a quality of service process according to an implementation of the present disclosure.

Referring to FIG. 1, there is shown quality of service process 10. For the following discussion, it is intended to be understood that quality of service process 10 may be implemented in a variety of ways. For example, quality of service process 10 may be implemented as a server-side process, a client-side process, or a server-side/client-side process.

For example, quality of service process 10 may be implemented as a purely server-side process via quality of service process 10s. Alternatively, quality of service process 10 may be implemented as a purely client-side process via one or more of client-side application 10c1, client-side application 10c2, client-side application 10c3, and client-side application 10c4. Alternatively still, quality of service process 10 may be implemented as a server-side/client-side process via server-side quality of service process 10s in combination with one or more of client-side application 10c1, client-side application 10c2, client-side application 10c3, and client-side application 10c4. In such an example, at least a portion of the functionality of quality of service process 10 may be performed by quality of service process 10s and at least a portion of the functionality of quality of service process 10 may be performed by one or more of client-side application 10c1, 10c2, 10c3, and 10c3.

Accordingly, quality of service process 10 as used in this disclosure may include any combination of quality of service process 10s, client-side application 10c1, client-side application 10c2, client-side application 10c3, and client-side application 10c4.

Figure 2:
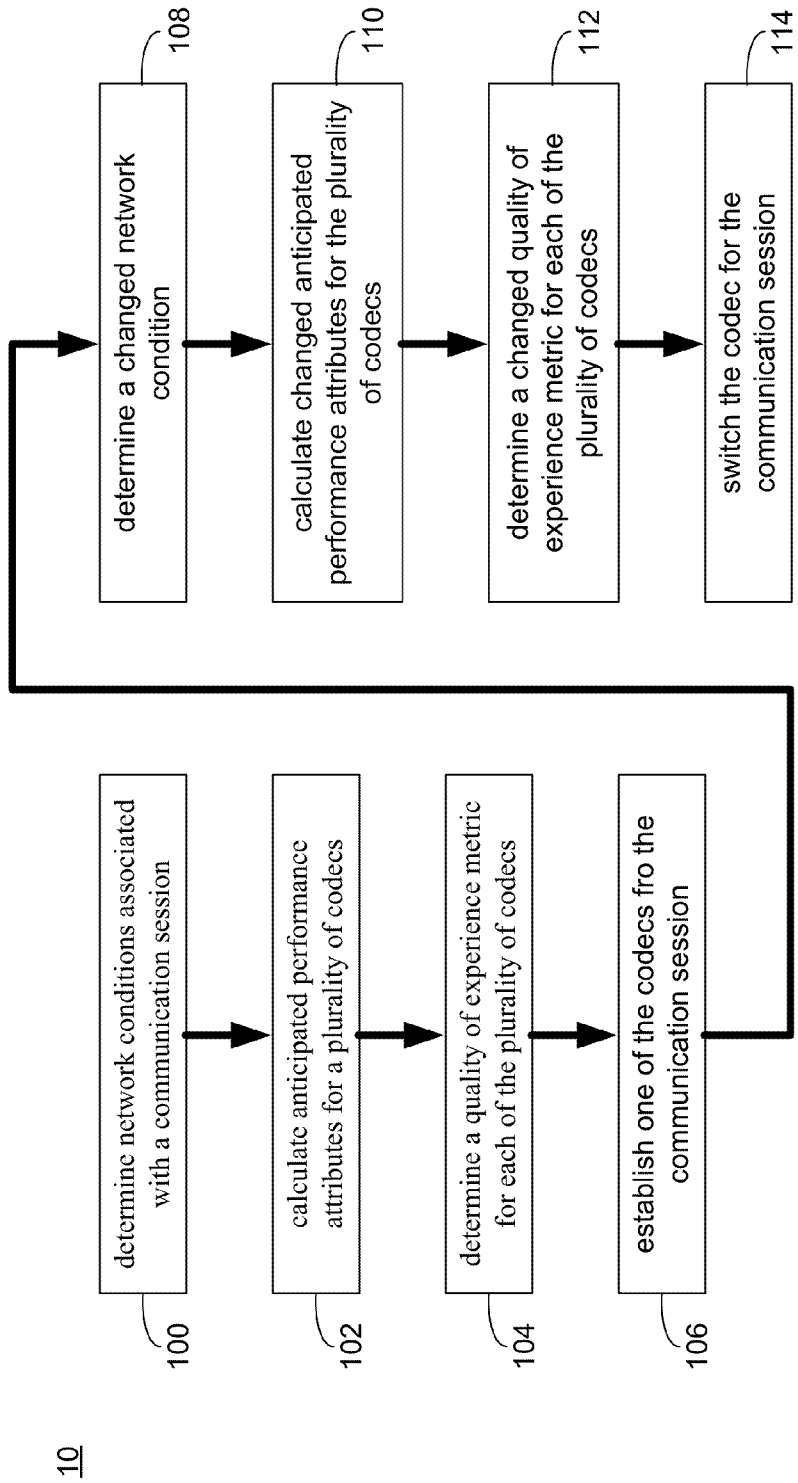
FIG. 2 is a flowchart of the quality of service process of FIG. 1, according to an implementation of the present disclosure.

Referring also to FIG. 2, and as will be discussed in greater detail below, quality of service process 10 may determine 100 network condition associated with a communication session. Quality of service process 10 may also calculate 102 one or more anticipated performance attributes for each of a plurality of error correction codes based on the network condition. Quality of service process 10 may also determine 104 a quality of experience metric for each of the plurality of error correction codes based on the calculated one or more anticipate performance attributes for each of the plurality of error correction codes. Quality of service process 10 may further establish 106 one of the plurality of error correction codes for the communication session based on the quality of experience metric for each of the plurality of error correction codes.

Quality of service process 10s may be a server application and may reside on and may be executed by computing device 12, which may be connected to network 14 (e.g., the Internet or a local area network). Examples of computing device 12 may include, but are not limited to: a personal computer, a server computer, a series of server computers, a mini computer, a mainframe computer, or a dedicated network device.

The instruction sets and subroutines of quality of service process 10s, which may be stored on storage device 16 coupled to computing device 12, may be executed by one or more processors (not shown) and one or more memory architectures (not shown) included within computing device 12. Examples of storage device 16 may include but are not limited to: a hard disk drive; a tape drive; an optical drive; a RAID device; an NAS device, a Storage Area Network, a random access memory (RAM); a read-only memory (ROM); and all forms of flash memory storage devices.

Network 14 may be connected to one or more secondary networks (e.g., network 18), examples of which may include but are not limited to: a local area network; a wide area network; or an intranet, for example.

Examples of client-side applications 10c1, 10c2, 10c3, 10c4 may include but are not limited to, one or more of a voice-over-IP application, a video-over-IP application, a web browser, or a specialized application (e.g., an application running on a mobile platform). The instruction sets and subroutines of client-side application 10c1, 10c2, 10c3, 10c4, which may be stored on storage devices 20, 22, 24, 26 (respectively) coupled to client electronic devices 28, 30, 32, 34 (respectively), may be executed by one or more processors (not shown) and one or more memory architectures (not shown) incorporated into client electronic devices 28, 30, 32, 34 (respectively). Examples of storage devices 20, 22, 24, 26 may include but are not limited to: hard disk drives; tape drives; optical drives; RAID devices; random access memories (RAM); read-only memories (ROM), and all forms of flash memory storage devices.

Examples of client electronic devices 28, 30, 32, 34 may include, but are not limited to, personal computer 28, laptop computer 30, mobile computing device 32, notebook computer 34, a netbook computer (not shown), a server computer (not shown), a gaming console (not shown), a data-enabled television console (not shown), and a dedicated network device (not shown). Client electronic devices 28, 30, 32, 34 may each execute an operating system.

Users 36, 38, 40, 42 may access quality of service process 10 directly through network 14 or through secondary network 18. Further, quality of service process 10 may be accessed through secondary network 18 via link line 44.

The various client electronic devices (e.g., client electronic devices 28, 30, 32, 34) may be directly or indirectly coupled to network 14 (or network 18). For example, personal computer 28 is shown directly coupled to network 14. Further, laptop computer 30 is shown wirelessly coupled to network 14 via wireless communication channels 46 established between laptop computer 30 and wireless access point (WAP) 48. Similarly, mobile computing device 32 is shown wirelessly coupled to network 14 via wireless communication channel 50 established between mobile computing device 32 and cellular network/bridge 52, which is shown directly coupled to network 14. WAP 48 may be, for example, an IEEE 802.11a, 802.11b, 802.11g, 802.11n, Wi-Fi, and/or Bluetooth device that is capable of establishing wireless communication channel 46 between laptop computer 30 and WAP 48. Additionally, personal computer 34 is shown directly coupled to network 18 via a hardwired network connection.

In some embodiments, quality of service process 10 may communicate with, interact with, and/or include a component or module of a communication application (e.g., communication application 54). As is generally known, a communication application (e.g., communication application 54) may generally facilitate audio and/or video communications between individuals as participants in a communication session. For example, communication application 54 may facilitate voice over IP and/or video over IP communications between communication session participants. In some embodiments, a communication session may only include two participants. In some embodiments, a communication session may include more than two participants. In some embodiments, communication application 54 may include, and/or may interact with, for example, an electronic meeting application, a web conferencing application, or a similar application. An example of communication application 54 may include, but is not limited to, IBM Sametime®. (IBM Sametime is a registered trademark of International Business Machine Corporation in the United States, other countries, or both).

In an embodiment, the instruction sets and subroutines of electronic communication application 54 may be stored, e.g., on storage device 16 associated with server computer 12, which executes electronic communication application 54, and/or another suitable storage device. Further, users (e.g., one or more of users 36, 38, 40, 42) may access electronic communication application 54 in order to participate in an electronic communication session (such as a voice call, a video call, an electronic meeting, or other communication session type). The users may access electronic communication application 54 via one or more suitable applications, such as client side applications 10c1-10c4 (e.g., which may include a voice-over-IP application, a video-over-IP application, a web browser, a client electronic meeting application, or another application) and/or via a different application (not shown). As generally discussed above, a portion and/or all of the functionality of quality of service process 10 may be provided by one or more of client side applications 10c1-10c4. For example, in some embodiments quality of service process 10 (and/or client-side functionality of quality of service process 10) may be included within and/or interactive with client-side applications 10c1-10c4, which may include client side electronic communication applications, web browsers, or another application. Various additional/alternative configurations may be equally utilized.

As generally discussed above with reference to FIG. 2, quality of service process 10 may determine 100 network condition associated with a communication session. Quality of service process 10 may also calculate 102 one or more anticipated performance attributes for each of a plurality of error correction codes based on the network condition. Quality of service process 10 may also determine 104 a quality of experience metric for each of the plurality of error correction codes based on the calculated one or more anticipate performance attributes for each of the plurality of error correction codes. Quality of service process 10 may further establish 106 one of the plurality of error correction codes for the communication session based on the quality of experience metric for each of the plurality of error correction codes.

For example, server computer 12 (e.g., via electronic communication application 54 and/or additional or alternative electronic communication applications) may host a plurality of communication sessions between different groups of respective participants. As discussed above, examples of electronic communication sessions hosted server computer 12 may include, but are not limited to voice communications, video communications, electronic meetings, and the like. Quality of service process 10 may determine 100 network conditions associated with a communication session. For example, network problems or conditions, such as network congestion, etc., may impact the perceived quality of experience for participants of a communication session, such as by resulting in packet loss, one-way delays, etc. Accordingly, quality of service process 10 may determine 100 network conditions associated with the communication session, e.g., for determining the effects of the network on the communication session.

In an embodiment, determining 100 network conditions associated with the communication session may include, for example, monitoring packet loss experienced by the participants of the communication session, network jitter, burst ratios, buffer length queue associated with communication streams, latency, and the like. In various embodiments, determining 100 the network conditions associated with the communication session may include continuously monitoring the network conditions and/or intermittently monitoring the network conditions associated with the communication session. For example, in an embodiment determining 100 the network condition associated with the communication session may be in response to a request to establish the communication session. For example, quality of service process 10 may determine 100 the network conditions when the one of the participants begins the communication session, as by calling another of the participants of the communication session.

Figure 3:
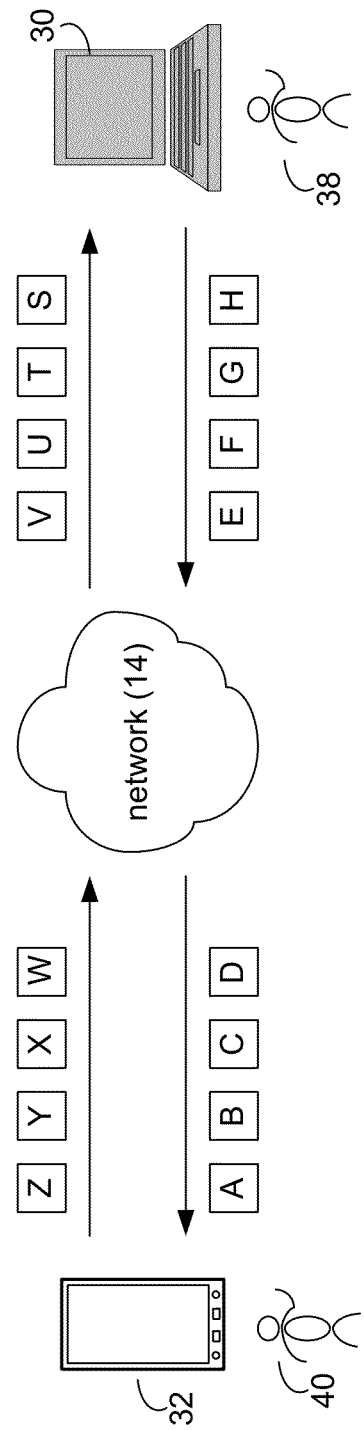
FIG. 3 diagrammatically depicts an implementation of the quality of service process of FIG. 1, according to an example embodiment.

In an embodiment, quality of service process 10 may determine 100 the network condition associated with the communication session may be in response to receiving an indication of a poor quality of experience associated with the communication session. For example, and referring also to FIG. 3, users 38 and 40 may participate in a communication session, e.g., which may include respective communication session traffic packets A, B, C, D, E, F, G, H and S, T, U, V, W, X, Y, Z. At a point in time (e.g., when the call between user 38 and user 40 is initiated), the network conditions may be such that the quality of experience of for the users may be satisfactory, with a normal flow of communication traffic packets between the users.

Figure 4:
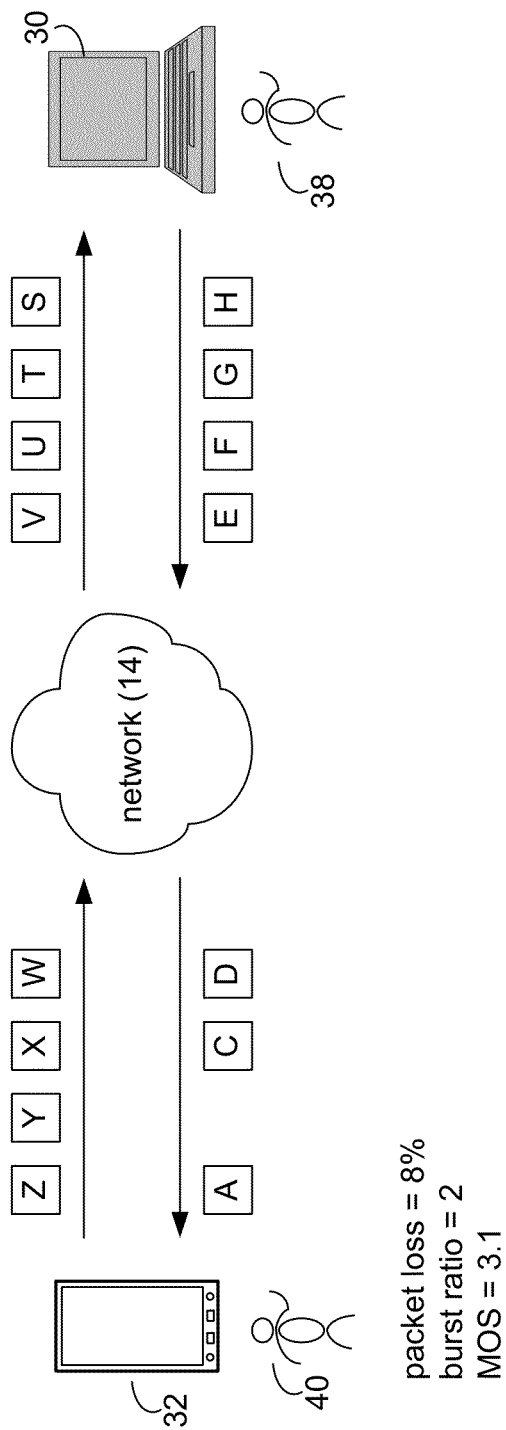
FIG. 4 diagrammatically depicts an implementation of the quality of service process of FIG. 1, according to an example embodiment.

Referring also to FIG. 4, at some point during the communication session, the network conditions may change, for example, due to increased network congestion, etc., resulting in a degradation in the quality of experience of the communication session for user 40. For example, as a result of the change in network conditions user 40 may experience a packet loss rate of 8% (e.g., wherein a packet loss rate greater than 5% may be considered detrimental to voice quality), and a bust ratio of 2, giving rise to a mean opinion score ("MOS") of 3.1, which indicated that user 40 may be unsatisfied with the quality of experience of the communication session. It will be appreciated that various other changes in network conditions may give rise to an unsatisfactory quality of experience, and that indicators other than MOS may be utilized indicate a perceived participant quality of experience with the communication session.

Figure 5:
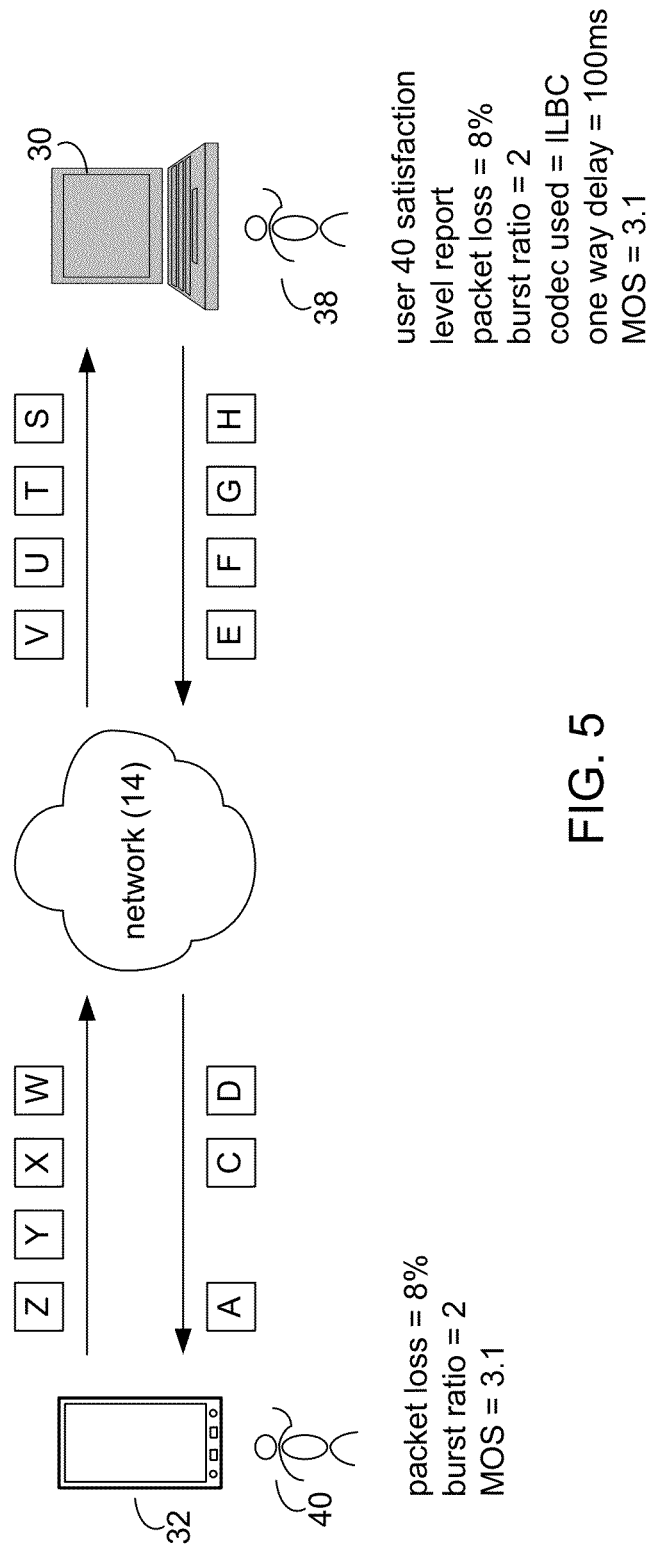
FIG. 5 diagrammatically depicts an implementation of the quality of service process of FIG. 1, according to an example embodiment.

Based on the unsatisfactory quality of experience for user 40 (e.g., as reflected by an MOS of 3.1 in the example embodiment), quality of service process 10 may receive an indication of user 40's unsatisfactory quality of experience. For example, and referring also to FIG. 5, a real-time transport protocol control protocol (RTCP) message may be transmitted to client device 30 (via which user 38 may participate in the communication session). In an embodiment, the RTCP message may report that user 40 is experiencing poor quality of experience, and may report the particular attributes of the quality of experience for user 40 (e.g., packet loss of 8%, burst ratio of 2, one-way delay of 100 ms). In an embodiment, the RTCP message may also indicate the currently utilized codec (e.g., iLBC in the illustrated embodiment). In response to receiving the indication of a poor quality of experience associated with user 40, quality of service process 10 (e.g., via one or more of quality of service process 10s, client-side application 10c3, and client-side application 10c2) may determine 100 the network conditions associated with the communication session (e.g., to identify the network characteristic that may cause the poor quality of experience for user 40). It will be appreciated that the indication of the poor quality of experience associated with the participant of the communication session may include an indication other than an RTCP message.

Quality of service process 10 may calculate 102 one or more anticipated performance attributes for each of a plurality of error correction codes based on the network condition. For example, a plurality of different error correction codes may be utilized, e.g., to correct for lost packets associated with an audio stream of the communication session. For example, Reed-Solomon error correction code may be utilized in connection with communication sessions to recover lost packets. A variety of different Reed-Solomon codes exist that may be utilized to provide different results for depending upon network characteristics. The different error correction codes may provide different performance attributes (for example, different degree of packet recovery/prevention of packet loss, resultant increases in delay, changes in burst ratio, and the like) depending upon the exact network conditions being experienced by the network through which the packets of the communication session are being routed. As such, the performance attributes may be termed "anticipated," in that the calculated 102 performance attributes are what would be expected given the network conditions. Accordingly, quality of service process 10 may calculate 102 one or more performance attributes that may result from the use of each of the plurality of error correction codes given the determined 100 network conditions and/or anticipated future network conditions.

In an embodiment, the calculated 102 anticipated performance attributes may include one or more of packet loss, burst ratio, and one way delay, that may result from the use of each error correction code given the current, and/or anticipated future, determined 100 network conditions. Accordingly, calculating 102 the anticipated performance attributes for each of the plurality of error correction codes may provide an indication and/or prediction of the performance of each of the different error correction codes for the network conditions, e.g., in terms of an awareness of how the different codes may effect the communication session.

Quality of service process 10 may determine 104 a quality of experience metric for each of the plurality of error correction codes based on the calculated one or more anticipate performance attributes for each of the plurality of error correction codes. For example, and as generally discussed above, a quality of experience metric (such as MOS) may be utilized to quantify a quality of experience for a participant of a communication session. In an embodiment, the various performance attributes calculated 102 for each of the plurality of error correction codes may impact a quality of experience associated with the communication session. For example, the transmission of redundant data to correct for packet loss may increase the one way delay associated with the communication session. While a certain degree of increase in the delay may be considered acceptable, in some situations the delay may increase to the point that the conversational quality of experience for one or more participants in the communication session may be degraded and unsatisfactory. Different ones of the error correction codes may provide different degrees of correction for packet loss (e.g., by utilizing different parity data, etc.) that may be more or less effective given the determined 100 current or anticipated future network conditions. Similarly, the different ones of the error correction codes may result in different degrees of delay, and the like. The combination of the packet loss (e.g., degree of packet loss correction and/or degree of continuing packet loss after correction), the one way delay time, etc. resulting from the application of the different error correction codes for a given network condition may result in different quality of experience for participants in the communication session. Accordingly, different error correction codes may provide different tradeoffs, e.g., with respect to packet loss correction, delay, etc., which may result in different quality of experience.

In an embodiment, quality of service process 10 may determine 104 a quality of experience metric for each of the plurality of error correction codes based on the calculated one or more anticipate performance attributes for each of the plurality of error correction codes including calculating the quality of experience metric that would result from the calculated 102 performance attributes for each of the error correction codes. In an embodiment, quality of service process 10 may determine 104 a quality of experience metric for each of the plurality of error correction codes based upon the calculated one or more anticipated performance attributes for each of the plurality of error correction codes based upon, at least in part, a mapping between the performance attributes and an associated quality of experience metric. For example, an error correction code, quality of experience metric, calculated performance attribute (and/or network condition) matrix may be provided. In an example embodiment, the matrix may correlate quality of experience metric with calculated performance attributes (and/or network conditions) for each of the various error correction codes. Accordingly, the mapping (e.g., by way of the matrix, or other suitable mapping paradigm) may indicate a resulting quality of experience metric (e.g., MOS) that may result from the use of a given error correction code for a given network condition (e.g., which may result in a particular calculated 102 performance attribute for the given error correction code and given network condition). Various additional and/or alternative correlations between error correction code, performance attribute (and/or network condition), and quality of experience metric may similarly be utilized to determine the quality of experience metric for each of the plurality of error correction codes.

Figure 6:
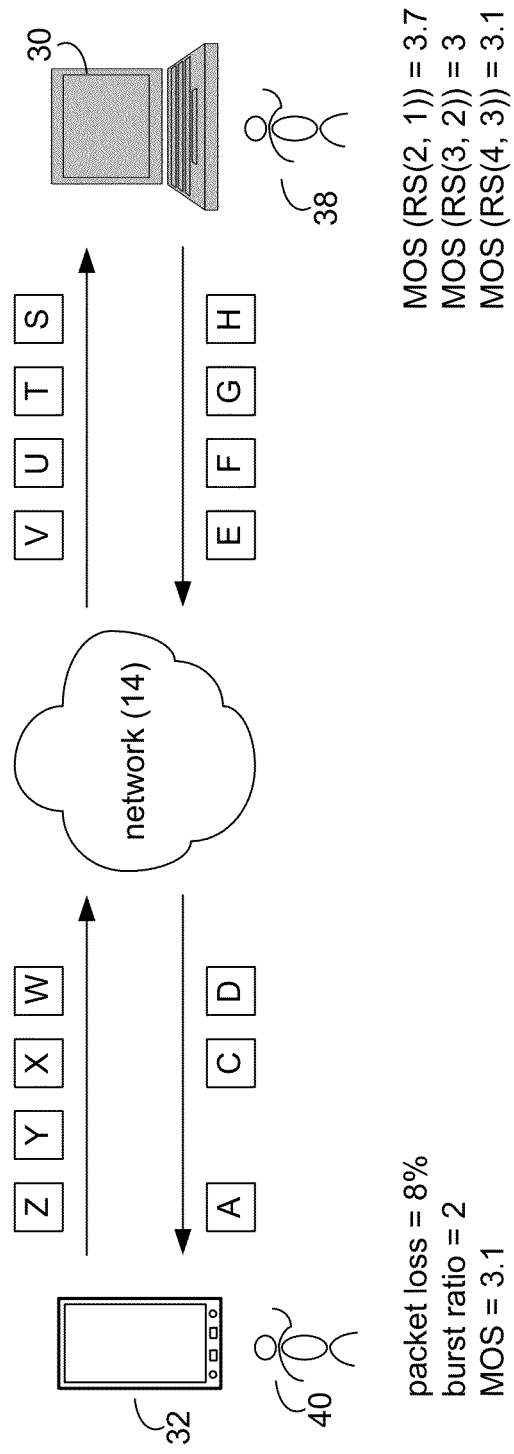
FIG. 6 diagrammatically depicts an implementation of the quality of service process of FIG. 1, according to an example embodiment.

For example, and referring also to FIG. 6, in an embodiment, quality of service process 10 may determine 104 a quality of experience metric for each of a plurality of error correction codes based on the calculated 102 performance attributes for each error correction code for the determined 100 network conditions. As discussed above, in an example embodiment the error correction codes may include Reed-Solomon codes, as may be used in connection with forward error correction. For example, in the illustrated embodiment three different possible Reed-Solomon are shown as possible error correction codes for the communication session, namely error correction codes RS(2, 1), RS(3, 2), and RS(4, 3). It will be appreciated that error correction codes other than Reed-Solomon codes may be utilized in connection with the present disclosure. Further, it will be appreciated that the plurality of error correction codes may include a greater, or fewer, number of possible error correction codes than the three Reed-Solomon codes depicted for the purpose of illustration.

As shown in FIG. 6, a quality of experience metric (e.g., MOS) may be determined 104 for each of the three Reed-Solomon error correction codes (e.g., RS(2, 1), RS(3, 2), and RS(4, 3)). The MOS determined 104 for each of the three Reed-Solomon error correction codes may be based upon, at least in part, one or more calculated 102 anticipated performance attributes that may be achieved by each of the Reed-Solomon error correction codes based on the determined 100 current, or anticipated future, network conditions. For example, given the determined network conditions error correction code RS(2, 1) may be expected to provide an MOS of 3.7, error correction code RS(3, 2) may be expected to provide an MOS of 3, and error correction code RS(4, 3) may be expected to provide an MOS of 3.1. As generally discussed above, the quality of experience metric may be determined 104 by calculating the quality of experience metric and/or by referencing, e.g., a matrix, table, etc., correlating error correction codes, network conditions (and/or performance attributes), and quality of experience metrics. As shown in the illustrated embodiment, for the determined 100 network conditions the error correction code RS(2, 1) may provide the best quality of experience (e.g., indicated by the highest MOS score) for the communication session at the determined 100 network conditions.

Figure 7:
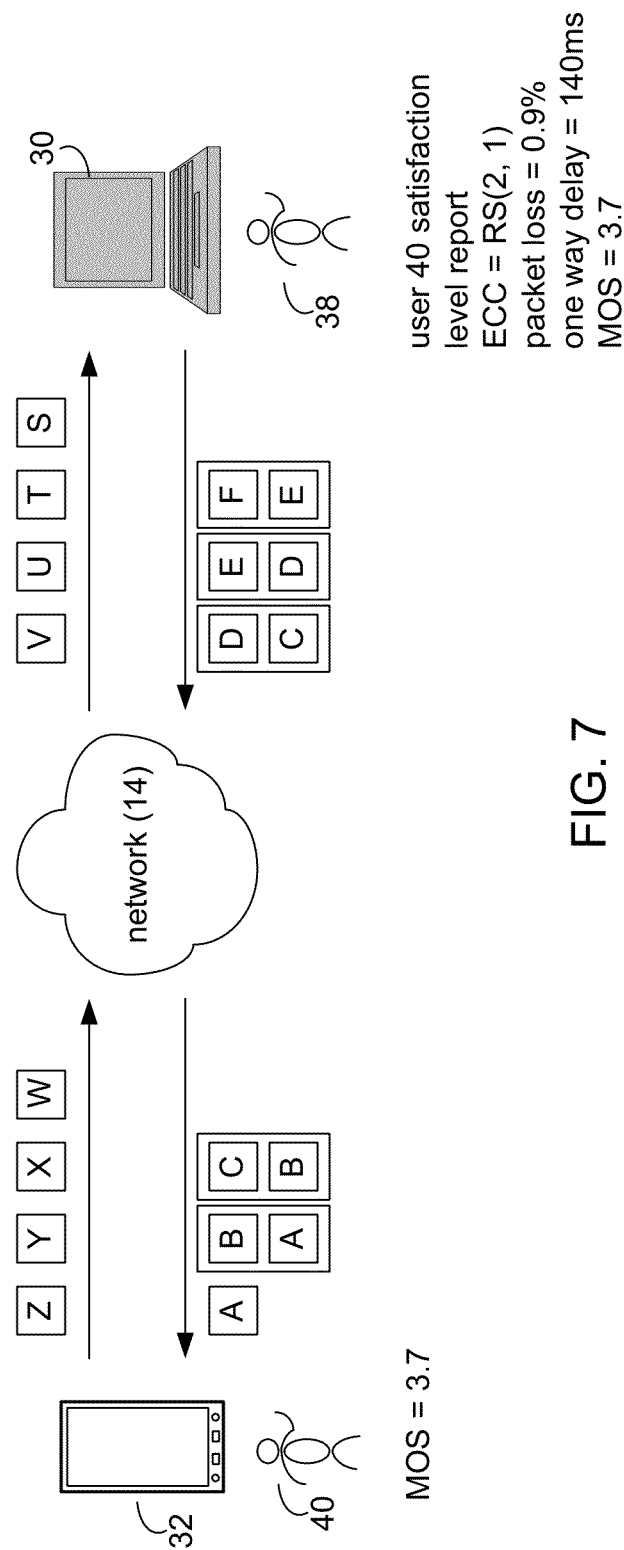
FIG. 7 diagrammatically depicts an implementation of the quality of service process of FIG. 1, according to an example embodiment.

Quality of service process 10 may establish 106 one of the plurality of error correction codes for the communication session based on the quality of experience metric for each of the plurality of error correction codes. For example, based on a determination of which of the error correction codes may perform the best (e.g., may provide the highest quality of experience for the participants of the communication session), quality of service process 10 may establish the error correction code providing the best quality of experience as the error correction code to be used for the communication session. Referring also to FIG. 7, and continuing with the above example, the RS(2, 1) error correction code may be utilized for the communication session. As shown in the example of FIG. 7, the RS(2, 1) error correction code may greatly reduce the packet loss (e.g., as by transmitting redundant error correction data with the audio stream of the communication session), for example, reducing the packet loss from 8% to 0.9%, while only slightly increasing the one way delay (e.g., from 100 ms to 140 ms in the illustrated example). Accordingly, by establishing the RS(1, 2) error correction code for the communication and MOS quality of experience metric of 3.7 may be achieved for user 40. It will be appreciated that the example values and error correction codes described with respect to the illustrated examples are intended for the purpose of illustration, and should now be construed as a limitation on the present disclosure.

Over the course of the communication session (e.g., subsequent to establishing 106 the one of the plurality of error correction codes for the communication session) the network conditions may change. It will be appreciated that changes in the network conditions may alter the performance of the currently established error correction code. For example, as a result of the changes in network conditions the currently established error correction code may not achieve a satisfactory (and/or optimum) quality of experience for one or more of the participants of the communication session. Accordingly, in some embodiments quality of service process 10 may determine 108 a changed network condition associated with the communication session. In some embodiments, quality of service process 10 may determine 108 the changed network conditions by one or more of continuously and/or intermittently (e.g., at defined time intervals, or the like) monitoring network conditions associated with the communication session. In some embodiments, determining 108 the changed network condition may be in response to receiving an indication of a poor quality of experience associated with the communication session. For example, in a similar manner as generally discussed above, in the event of a participant experiencing a poor quality of experience, a quality of experience report (such as an RTCP message, or other suitable indicator) may be transmitted indicating the poor quality of experience. The RTCP message may be received by the quality of service process 10.

In a similar manner as described above, quality of service process 10 may calculate 110 one or more changed anticipated performance attributes for each of the plurality of error correction codes based on the changed network condition. For example, quality of service process 10 may calculate 110 performance attributes that would be expected to result from the use of each or plurality of error correction codes resulting from the changed network conditions. Further, quality of service process 10 may also determine 112 a changed quality of experience metric for each of the plurality of error correction codes based on the changed anticipated performance attributes for each of the plurality of error correction codes. For example, in the case of the previously discussed Reed-Solomon error correction codes, an MOS (or other suitable quality of experience metric) may be determined 112 for each of the error correction codes RS(2, 1), RS(3, 2), and RS(4, 3). As such, quality of service process 10 may identify an error correction code that may provide a satisfactory, and/or an optimum, quality of experience for the participants of the communication session for the changed network conditions. Also in a similar manner as discussed above, quality of service process 10 may determine 112 the quality of experience metric for each of the plurality of error correction codes for the changed network condition including calculating the quality of experience metric and/or referencing a matrix, table, etc., correlating quality of experience metric, error correction code, and calculated performance attribute for each error correction code (and/or network condition).

Figure 8:
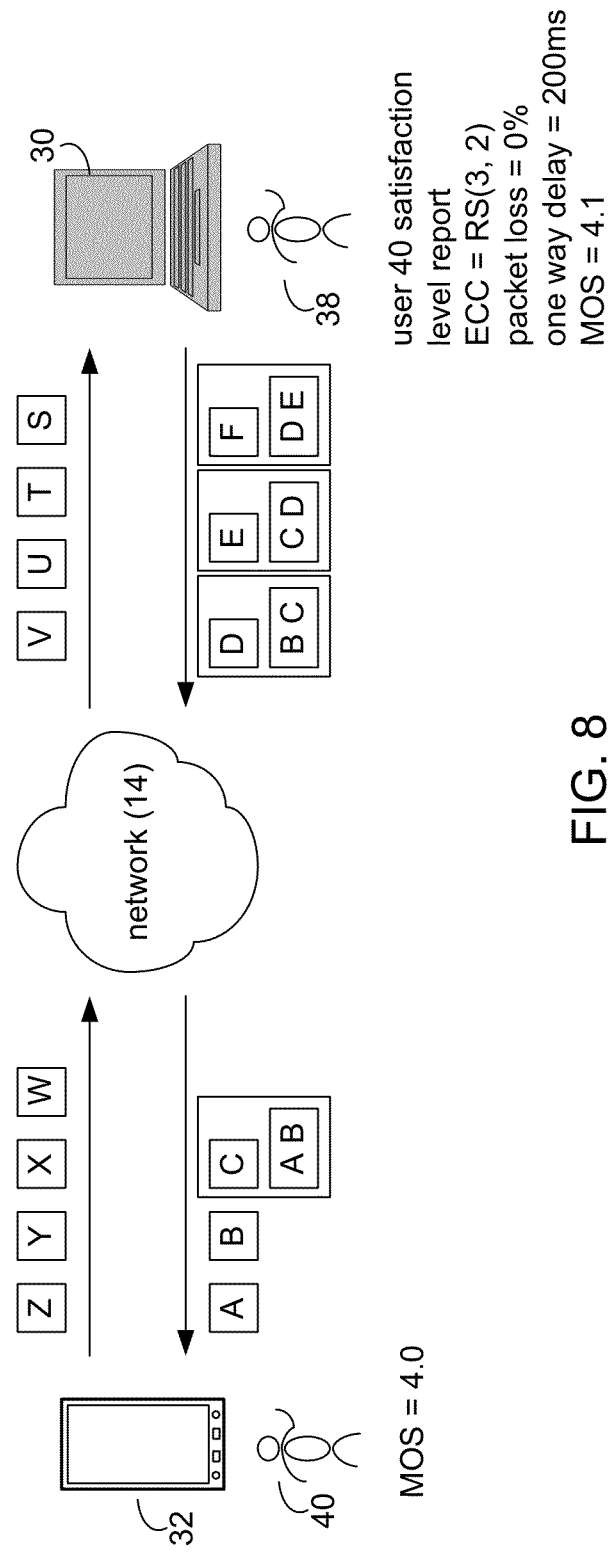
FIG. 8 diagrammatically depicts an implementation of the quality of service process of FIG. 1, according to an example embodiment.

Quality of service process 10 may switch 114 the error correction code for the communication session to one of the plurality of error correction codes based on the changed quality of experience metric for each of the plurality of error correction codes. For example, and referring to FIG. 8, in consideration of the determined 108 changed network condition and calculated 110 anticipated performance attributes for each of the plurality of error correction codes for the changed network condition, quality of service process 10 may determine which of the plurality of error correction codes may provide a satisfactory (and/or optimum) quality of experience (e.g., based on the determined 112 quality of experience metrics). Quality of service process 10 may switch 114 the error correction code for the communication session from a currently used error correction code to the error correction code determined to provide satisfactory and/or optimum quality of experience for the communication session given the changed network conditions. For example, as shown in FIG. 8, in view of the changed network conditions, quality of service process 10 may determine that the RS(3, 2) error correction code may provide satisfactory quality of experience for the changed network conditions. As such, quality of service process 10 may switch 114 the error correction code from RS(2, 1) to RS(3, 2). In the foregoing manner, quality of service process 10 may adaptively select and change error correction codes based on the current (and/or predicted future) network conditions. By adaptively selecting and changing the error correction codes through the course of the communication session, it may be possible to provide a satisfactory and/or a best available or possible, quality of experience for the participants of the communication session, given the changing network conditions throughout the course of the communication session.

Figure 9:
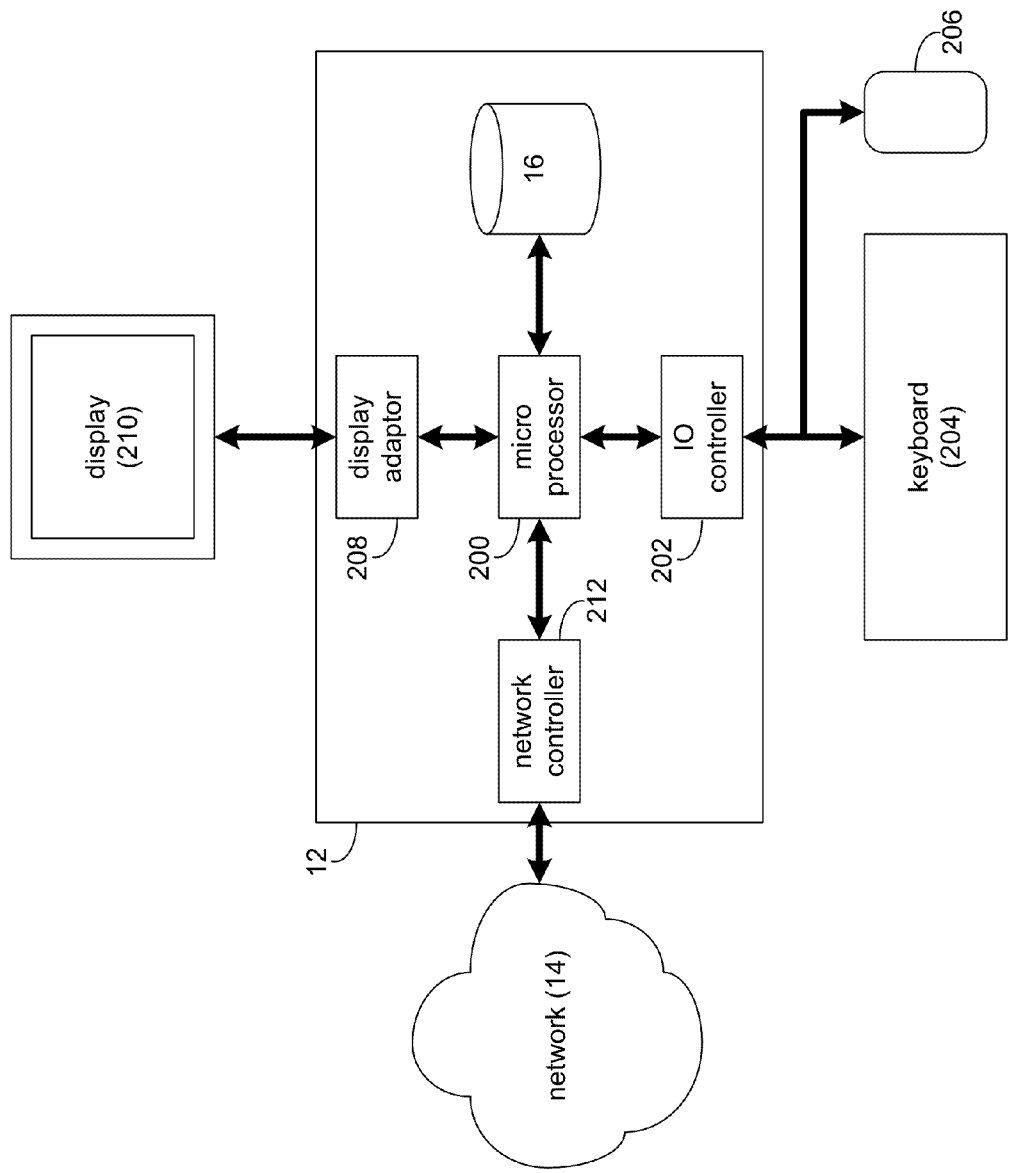
FIG. 9 is a diagrammatic view of the computing device of FIG. 1, according to an implementation of the present disclosure.

Referring also to FIG. 9, there is shown a diagrammatic view of computing system 12. While computing system 12 is shown in this figure, this is for illustrative purposes only and is not intended to be a limitation of this disclosure, as other configuration are possible. For example, any computing device capable of executing, in whole or in part, quality of service process 10 may be substituted for computing device 12 within FIG. 3, examples of which may include but are not limited to client electronic devices 28, 30, 32, 34.

Computing system 12 may include microprocessor 200 configured to e.g., process data and execute instructions/code for screen capture process 10. Microprocessor 200 may be coupled to storage device 16. As discussed above, examples of storage device 16 may include but are not limited to: a hard disk drive; a tape drive; an optical drive; a RAID device; an NAS device, a Storage Area Network, a random access memory (RAM); a read-only memory (ROM); and all forms of flash memory storage devices. IO controller 202 may be configured to couple microprocessor 200 with various devices, such as keyboard 204, mouse 206, USB ports (not shown), and printer ports (not shown). Display adaptor 208 may be configured to couple display 210 (e.g., a CRT or LCD monitor) with microprocessor 200, while network adapter 212 (e.g., an Ethernet adapter) may be configured to couple microprocessor 200 to network 14 (e.g., the Internet or a local area network).

As will be appreciated by one skilled in the art, the present disclosure may be embodied as a method (e.g., executing in whole or in part on computing device 12), a system (e.g., computing device 12), or a computer program product (e.g., encoded within storage device 16). Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium (e.g., storage device 16) having computer-usable program code embodied in the medium.

Any suitable computer usable or computer readable medium (e.g., storage device 16) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium may include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. The computer-usable or computer-readable medium may also be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to the Internet, wireline, optical fiber cable, RF, etc.

Computer program code for carrying out operations of the present disclosure may be written in an object oriented programming language such as Java, C#.NET, PHP, C++ or the like. However, the computer program code for carrying out operations of the present disclosure may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network/a wide area network/the Internet (e.g., network 14).

The present disclosure is described with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, may be implemented by computer program instructions. These computer program instructions may be provided to a processor (e.g., processor 200) of a general purpose computer/special purpose computer/other programmable data processing apparatus (e.g., computing device 12), such that the instructions, which execute via the processor (e.g., processor 200) of the computer or other programmable data processing apparatus, create means for implementing the functions/acts specified in the flowchart and/or block diagram block or blocks.

These computer program instructions may also be stored in a computer-readable memory (e.g., storage device 16) that may direct a computer (e.g., computing device 12) or other programmable data processing apparatus to function in a particular manner, such that the instructions stored in the computer-readable memory produce an article of manufacture including instruction means which implement the function/act specified in the flowchart and/or block diagram block or blocks.

The computer program instructions may also be loaded onto a computer (e.g., computing device 12) or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

The flowcharts and block diagrams in the figures may illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, may be implemented by special purpose hardware-based systems that perform the specified functions or acts, or combinations of special purpose hardware and computer instructions.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

Having thus described the disclosure of the present application in detail and by reference to embodiments thereof, it will be apparent that modifications and variations are possible without departing from the scope of the disclosure defined in the appended claims.

What is claimed is:

1. A computer-implemented method comprising:
   determining, by a processor, a network condition associated with a communication session;
   calculating, by the processor, one or more anticipated performance attributes for each of a plurality of error correction codes based on the network condition;
   determining, by the processor, a quality of experience metric for each of the plurality of error correction codes based on the calculated one or more anticipated performance attributes for each of the plurality of error correction codes; and
   establishing, by the processor, one of the plurality of error correction codes for the communication session based on the quality of experience metric for each of the plurality of error correction codes.

2. The computer-implemented method of claim 1, wherein determining the network condition associated with the communication session is in response to a request to establish the communication session.

3. The computer-implemented method of claim 1, wherein determining the network condition associated with the communication session is in response to receiving an indication of a poor quality of experience associated with the communication session.

4. The computer-implemented method of claim 1, wherein the anticipated performance attributes include one or more of packet loss, burst ratio, and delay.

5. The computer-implemented method of claim 1, further including:
   determining a changed network condition;
   calculating one or more changed anticipated performance attributes for each of the plurality of error correction codes based on the changed network condition;
   determining a changed quality of experience metric for each of the plurality of error correction codes based on the changed anticipated performance attributes for each of the plurality of error correction codes; and
   switching an error correction code for the communication session to one of the plurality of error correction codes based on the changed quality of experience metric for each of the plurality of error correction codes.

6. The computer-implemented method of claim 5, wherein determining the changed network condition is in response to receiving an indication of a poor quality of experience associated with the communication session.

7. The computer-implemented method of claim 5, wherein determining the changed network condition includes monitoring network conditions associated with the communication session.

* * * * *